United States Patent
Caër et al.

(10) Patent No.: US 10,283,931 B2
(45) Date of Patent: May 7, 2019

(54) ELECTRO-OPTICAL DEVICE WITH III-V GAIN MATERIALS AND INTEGRATED HEAT SINK

(71) Applicant: International Business Machines Corporation, Armonk, NY (US)

(72) Inventors: Charles Caër, Adliswil (CH); Herwig Hahn, Adliswil (CH)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/587,754

(22) Filed: May 5, 2017

(65) Prior Publication Data
US 2018/0323574 A1    Nov. 8, 2018

(51) Int. Cl.
*H01S 5/024*    (2006.01)
*H01S 5/02*     (2006.01)
(Continued)

(52) U.S. Cl.
CPC .......... *H01S 5/02476* (2013.01); *H01L 23/34* (2013.01); *H01S 3/2375* (2013.01); *H01S 5/02461* (2013.01); *H01S 5/343* (2013.01); *H01S 5/50* (2013.01); *H01S 5/021* (2013.01); *H01S 5/02469* (2013.01);
(Continued)

(58) Field of Classification Search
CPC ............. H01S 5/02476; H01S 5/02461; H01S 5/02484; H01S 3/2375; H01S 5/0424; H01S 5/021; H01S 5/343; H01S 5/125
See application file for complete search history.

(56) References Cited

U.S. PATENT DOCUMENTS 8,787,417 B2    7/2014 Baets et al.
9,316,785 B2    4/2016 Krasulick et al.
(Continued)

FOREIGN PATENT DOCUMENTS

CN    102904159 A    1/2013
EP    2 866 316 A1    10/2013

OTHER PUBLICATIONS

List of IBM Patents or Patent Applications Treated as Related.
(Continued)

*Primary Examiner* — Yuanda Zhang
(74) *Attorney, Agent, or Firm* — Scully, Scott, Murphy & Presser, P.C.; Daniel Morris, Esq.

(57) ABSTRACT

An electro-optical device having two wafer components and a device fabrication method. A first wafer component includes a silicon substrate and a cladding layer on top thereof. The cladding layer comprises a cavity formed therein, wherein the cavity is filled with an electrically insulating thermal spreader, which has a thermal conductivity larger than that of the cladding layer. The second wafer component comprises a stack of III-V semiconductor gain materials, designed for optical amplification of a given radiation. The second wafer component is bonded to the first wafer component, such that the stack of III-V semiconductor gain materials is in thermal communication with the thermal spreader. In addition, the thermal spreader has a refractive index that is lower than each of the refractive index of the silicon substrate and an average refractive index of the stack of III-V semiconductor gain materials for said given radiation.

17 Claims, 5 Drawing Sheets

(51) Int. Cl.
  H01S 3/23    (2006.01)
  H01S 5/343   (2006.01)
  H01L 23/34   (2006.01)
  H01S 5/50    (2006.01)
  H01S 5/042   (2006.01)
  H01S 5/125   (2006.01)
  H01S 5/10    (2006.01)

(52) U.S. Cl.
  CPC ......... H01S 5/02484 (2013.01); H01S 5/0424 (2013.01); H01S 5/0425 (2013.01); H01S 5/1032 (2013.01); H01S 5/125 (2013.01); H01S 2304/04 (2013.01)

(56) References Cited

U.S. PATENT DOCUMENTS

| | | |
|---|---|---|
| 9,397,471 B2 | 7/2016 | Li et al. |
| 9,442,247 B2 | 9/2016 | Deepe |
| 2011/0222570 A1 | 9/2011 | Junesand et al. |
| 2015/0277041 A1* | 10/2015 | Nakagawa ............. G02B 6/122 385/14 |
| 2016/0094014 A1* | 3/2016 | Shin ...................... H01S 5/2031 372/45.01 |
| 2016/0266322 A1 | 9/2016 | Epitaux et al. |
| 2016/0274319 A1* | 9/2016 | Krasulick ............ G02B 6/4253 |
| 2016/0313504 A1* | 10/2016 | Ramaswamy ..... G02B 6/12004 |
| 2017/0018638 A1 | 1/2017 | Teo et al. |
| 2017/0214214 A1* | 7/2017 | Yang ..................... H01S 5/0425 |

OTHER PUBLICATIONS

Enright et al., "A Vision for Thermally Integrated Photonics Systems", Bell Labs Technical Journal, vol. 19, Jan. 2014, pp. 31-45.
Roelkens et al., "III-V/silicon photonics for on-chip and intra-chip optical interconnects", Wiley interScience, Laser & Photonics Review, received Jun. 22, 2009, revised Sep. 14, 2009, accepted Oct. 5, 2009, published online Jan. 14, 2010, DOI 10.1002/lpor.200900033, pp. 1-29.
International Search Report and Written Opinion dated Aug. 8, 2018, received in a corresponding foreign application PCT/IB2018/053033.

* cited by examiner

ELECTRO-OPTICAL DEVICE WITH III-V GAIN MATERIALS AND INTEGRATED HEAT SINK

BACKGROUND

The invention relates in general to the field of electro-optical devices including a stack of III-V semiconductor gain materials (e.g., as part of a laser, an optical detector or a semiconductor optical amplifier), as well as silicon photonics chips and methods of fabrication thereof. In particular, the invention is directed to electro-optical devices integrating heat spreaders and/or heat sinks. It notably concerns devices and methods for embedding a heat sink in a silicon photonics chip with an integrated, electrically-pumped laser.

The integration of III-V semiconductor gain materials (e.g., for light sources emitting at datacom and/or telecom wavelengths) in silicon photonics platforms is desired, should it be to obtain high bandwidth optical interconnects.

For instance, a III-V laser source based on lateral current injection (LCI) is particularly attractive, due to its small threshold current and footprint, and the possibility to embed it in the back-end of the line of a CMOS-fabricated chip (which enables a co-integration with other CMOS components). The thinner stack height of LCI lasers may notably allow the integration at smaller nodes than their vertical current injection counterparts. More generally, one may want to integrate several types of III-V stacks (for laser, detection or amplification purposes) in photonics platforms.

SUMMARY

According to a first aspect, the present invention is embodied as an electro-optical device, which comprises two wafer components. The first wafer component includes a silicon substrate and a cladding layer on top of the silicon substrate. The cladding layer comprises a cavity formed therein. The cavity is filled with an electrically insulating thermal spreader, which further has a thermal conductivity that is larger than that of the cladding layer. The second wafer component comprises a stack of III-V semiconductor gain materials, designed for optical amplification of a given radiation (wavelength range). The second wafer component is bonded to the first wafer component, so as for the stack of III-V semiconductor gain materials to be in thermal communication with the thermal spreader. In addition, the thermal spreader has a refractive index that is lower than each of the refractive index of the silicon substrate and an average refractive index of the stack of III-V semiconductor gain materials for said given radiation (wavelength range).

According to the above solution, the thermal spreader is integrated within the silicon platform, which enables efficient heat transfer from the III-V device and, in turn, allows thermal management of heat generated by active parts of the device, in operation. However, the integration of the thermal spreader(s) does not come at the cost of increasing dimensions of the electro-optical devices. Rather, the thermal spreaders are substituted for cladding material volume portions that would else be present, such that the integration of the spreaders does not substantially impact the thickness of the devices.

The cavity extends at least partly through the cladding layer. Preferably yet, the cavity in the cladding layer extends up to the silicon substrate. Thus, the thermal spreader that fills the cavity comes in contact with the silicon substrate. This way, the silicon substrate, which is of comparably large dimensions with respect to the integrated III-V component and the heat spreader, acts as a heat sink.

For thermal dissipation efficiency, the stack of III-V semiconductor gain materials is preferably structured so as to be vis-à-vis the thermal spreader. I.e., the resulting, structured III-V stack is opposite the thermal spreader, so as to (at least partly) face the latter.

In preferred embodiments, the thermal spreader has a thermal conductivity that is at least ten times larger than that of the cladding layer. It is indeed possible to embed a very efficient thermal conductor, which otherwise fulfils all requirements in terms of electrical resistivity and refractive index. In that respect, the thermal spreader has a refractive index that is preferably less than 3.1, or even less than 2.5 for wavelengths larger than 200 nm.

Preferably, the first wafer component is a silicon on insulator wafer and the cladding layer comprises: a first oxide layer, corresponding to a buried oxide of the silicon on insulator wafer; and a second oxide layer on top of the first oxide layer. The second oxide layer may indeed be needed for optical coupling purposes. The cavity may nonetheless extend through the second oxide layer and at least partly through the first oxide layer, so as for the heat spreader to be close to the silicon substrate and, if possible, in direct contact with.

In embodiments, the electro-optical device comprises a set of two or more cavities formed in the cladding layer (including the above cavity), wherein the cavities of the set are filled with respective thermal spreaders (including the above thermal spreader). Each of the thermal spreaders is electrically insulating and has a thermal conductivity that is larger than that of the cladding layer. Also, the stack of III-V semiconductor gain materials is arranged so as to be in thermal communication with all of the thermal spreaders. Having several thermal spreaders arranged in distinct cavities allows to dissipate heat from several component; it further makes it possible to have components provided in residual portions between the cavities.

For example, the electro-optical device may include two thermal spreaders separated by a residual portion of the cladding layer, which portion is arranged opposite the stack of III-V semiconductor gain materials. In addition, the electro-optical device may further comprise a silicon component (e.g., a silicon waveguide core) embedded in the residual portion of the cladding layer. This silicon component may have been obtained from an initial top silicon layer of the silicon on insulator wafer. Thus, advantage can be taken from the initial (top) silicon layer of the silicon on insulator substrate to process features, e.g., as needed to enable optical coupling from/to the III-V stack.

Preferably, the thermal spreader is a CMOS-compatible material. Thus, in embodiments, the electro-optical device may be a CMOS-fabricated device, wherein the stack of III-V semiconductor gain materials can be embedded in the back-end of the line of the electro-optical device.

In embodiments, the electro-optical device comprises an edge-emitting laser device (including the III-V stack). Having integrated thermal spreaders is of particular advantage in that case as the integration of laser sources on silicon through wafer bonding may else lead to excessive heat and thus degrade the performance of lasers. The laser device may for instance be embedded in the second wafer component so as to allow a common back-end of the line with other electronic components integrated within in the second wafer component. Preferably, this laser device is an edge-emitting, lateral current injection laser device, which allows the thickness of the device to be reduced. In variants, the laser device may nevertheless be an edge-emitting, vertical current injection laser device.

In terms of materials, the thermal spreader preferably comprises diamond, boron nitride and/or aluminum nitride, which materials meet all requirements as set forth above. Preferred is to use aluminum nitride, which can easily be processed, especially as the same materials can otherwise be used to obtain bonding layers and achieve wafer bonding. Moreover, in embodiments, the stack of III-V semiconductor gain materials comprises $In_{1-x-y}Al_xGa_yAs$, with $0 \leq x \leq 1$ and $0 \leq y \leq 1-x$, InGaAsP or InGaAsN.

According to another aspect, the invention is embodied as a silicon photonics chip, comprising an electro-optical device such as described in reference to embodiments, integrated therein.

According to a final aspect, the invention is embodied as a method of fabrication of such an electro-optical device. Essentially, the method relies on wafer bonding two components. The first component comprises a silicon substrate and a cladding layer on top of the silicon substrate, while the second component comprises a stack of III-V semiconductor gain materials, such as evoked earlier. A cavity is created in the cladding layer of the first component. The cavity is subsequently filled with an electrically insulating material to form a thermal spreader such as described above (having appropriate thermal conductivity, refractive index and electrical resistivity). The two components are wafer bonded and the stack of III-V semiconductor gain materials is further structured so as to obtain a structured stack that is vis-à-vis and in thermal communication with the thermal spreader formed.

Consistently with preferred embodiments of the electro-optical device, the cavity extends at least partly through the cladding layer. The cavity is preferably created by etching the cladding layer down to the silicon substrate and subsequently filled with a material to form the thermal spreader, so as for the latter to be in contact with the silicon substrate.

In embodiments, the first wafer component provided is a silicon on insulator wafer and the method further comprises, prior to creating said cavity, depositing a second oxide layer on a first oxide layer that corresponds to a buried oxide of the silicon on insulator wafer, so as to form said cladding layer. The cavity is subsequently etched through the second oxide layer so as for the cavity to at least partly reach into the first oxide layer.

The present fabrication methods may actually include the creation of a set of two or more cavities in the cladding layer, which are subsequently filled with a suited material to obtain thermal spreaders. The stack of III-V semiconductor gain materials is nevertheless structured so as for the resulting stack to be arranged opposite the thermal spreaders and in thermal communication therewith.

Finally, the first wafer components is preferably provided as a silicon on insulator wafer that comprises: a silicon substrate; a first oxide layer on top of the silicon substrate; and a top silicon layer on top of the first oxide layer. The top silicon layer of the silicon on insulator wafer is structured to obtain a silicon component and a second oxide layer is deposited on top of the first oxide layer of the first wafer component, so as to form a cladding layer that comprises the first oxide layer and the second oxide layer, with the silicon component embedded therein. The cavities subsequently created are separated by a residual portion of cladding layer in between, in which the silicon component is embedded, e.g., for optical coupling purposes.

Devices fabrication methods embodying the present invention will now be described, by way of non-limiting examples, and in reference to the accompanying drawings.

Figure 1:
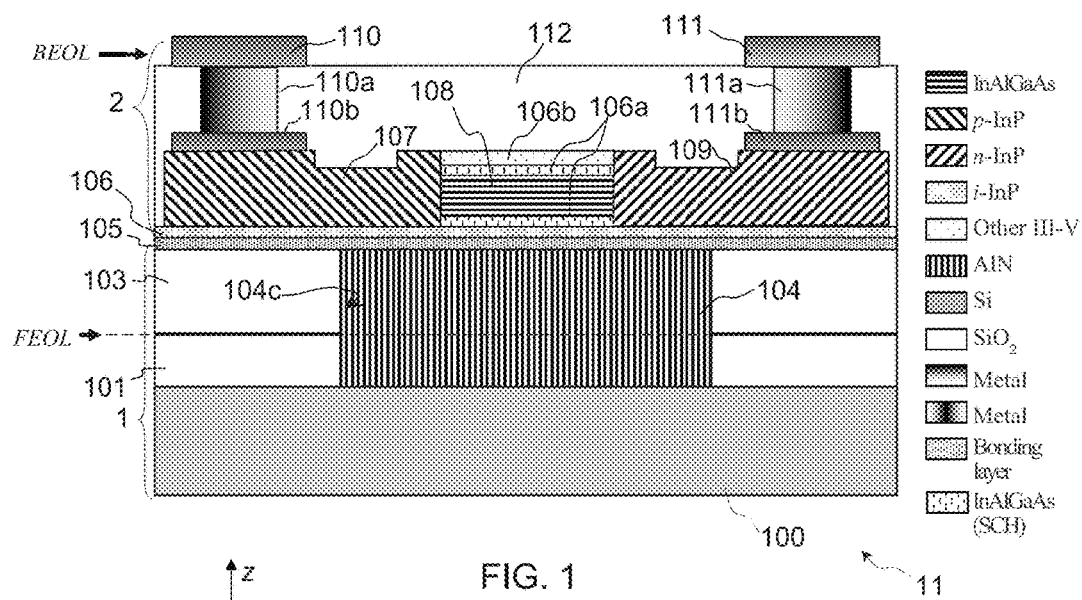
FIGS. 1-3 are simplified 2D cross-sectional views of electro-optical devices with thermal spreaders and heat sinks integrated therein, according to embodiments that comprise an edge-emitting laser device including a stack of III-V semiconductor gain materials with FIG. 1 depicting a lateral current injection device, and FIGS. 2 and 3 depicting vertical current injection devices with FIG. 3 additionally comprising a silicon waveguide embedded in a cladding layer, underneath the III-V materials stack.

The accompanying drawings show simplified representations of devices or parts thereof, as involved in embodiments. Technical features depicted in the drawings are not necessarily to scale. Similar or functionally similar elements in the figures have been allocated the same numeral references, unless otherwise indicated.

DETAILED DESCRIPTION OF EMBODIMENTS OF THE INVENTION

As noted in introduction, one may want to integrate III-V stacks in photonics platforms. Altogether, one wishes to reduce the thickness of the resulting devices. Now, as one may realize, in order to dissipate the heat generated by III-V stacks in thin platforms, a thermal management is needed. This, however, typically requires adding heat spreading/heat sink components onto the platform, which, in turn, impacts the dimensions of the device and thus contradicts the very purpose of reducing dimensions of the devices. The present Inventors have therefore developed solutions to solve this problem.

In reference to FIGS. 1-4, an aspect of the invention is first described, which concerns electro-optical devices 11-14 that integrate thermal management of heat created by an active optical component of such devices. In each case, the present devices comprise two wafer components 1, 2.

The first wafer component 1 comprises a silicon (Si) substrate 100 and a cladding layer 101, 103, located on top of the Si substrate 100. The first component 1 may in fact initially be provided as a silicon on insulator (SOI) wafer, for reasons that will be given later.

The cladding layer 101, 103 comprises one or more cavities 104c formed therein. Each cavity 104c is filled with an electrically insulating material, so as to form a thermal spreader 104 (FIGS. 1, 2), or a set of spreaders 104a, 104b

Figure 3:
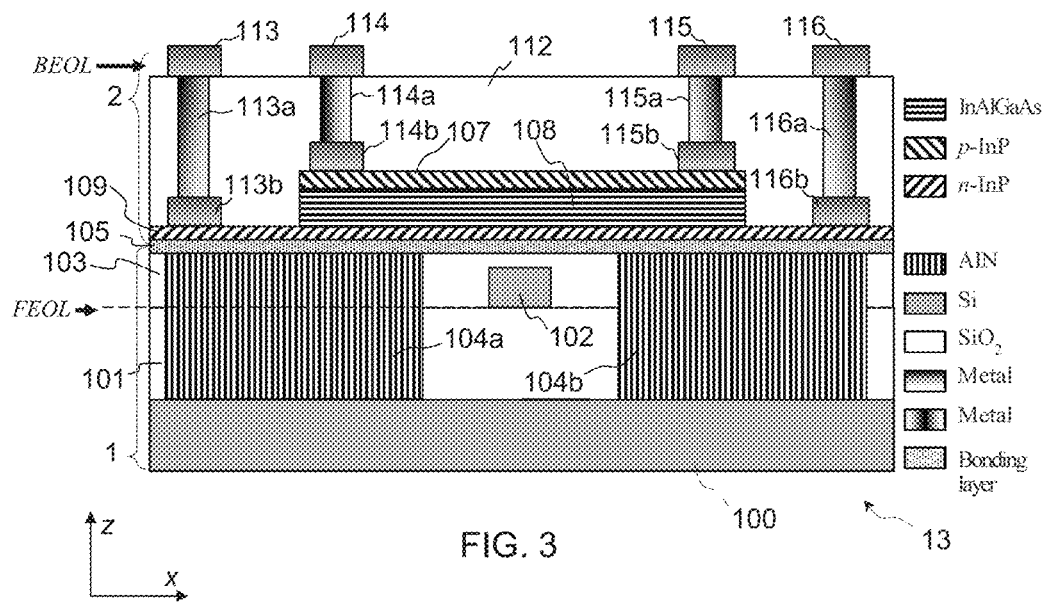
Figure 4:
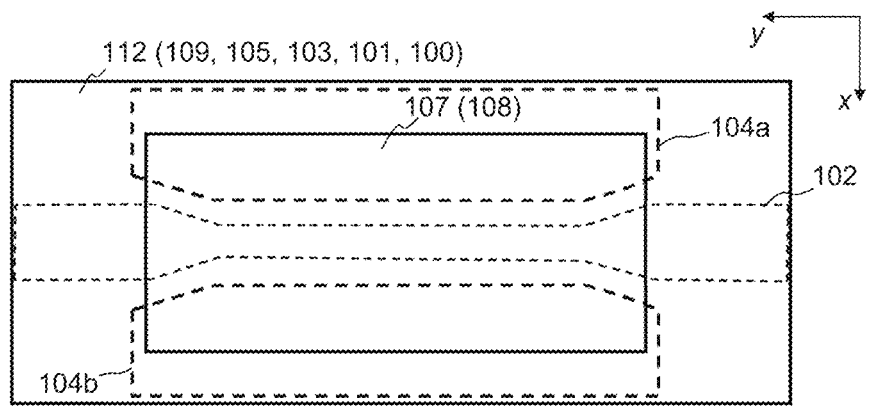
FIG. 4 is a (simplified) top view of a device as in FIG. 3, wherein some of the hidden components are denoted by dashed lines.

(FIGS. 3, 4). A cavity 104c is typically etched in the cladding layer 101, 103 and, this, preferably down to the Si substrate 100, as explained below. Thus the cladding layer 101, 103 is structured by the presence of one or more cavities and may possibly consists of layer portions aligned in-plane, parallel to a horizontal plane of the stack 108.

A thermal spreader as understood herein comprises a material that has a thermal conductivity that is substantially larger than the effective thermal conductivity of the cladding layer 101, 103. As present Inventors have concluded from their experiments, for the thermal spreader 104 to appreciably impact the thermal dissipation, the thermal conductivity of the thermal spreader should preferably be one or more orders of magnitude above the thermal conductivity of the cladding layer (e.g., exceed it by at least a factor 10 or so).

The electrical resistivity of the spreader 104 should, on the other hand, typically be of at least $10^4$ ohm-meter ($\Omega \cdot$m), in order to sufficiently insulate the III-V stack. In addition to its thermal conductivity and electrical resistivity, the thermal spreader 104 is further subject to additional requirements in terms of physical location and refractive index, as explained below.

The second wafer component 2 comprises the active optical component 106-109, which comprises a III-V stack 108, often referred to as a "III-V stack" (or even "stack") in the following. The stack 108 involves materials from the group of III-V compound semiconductors that provide the gain medium, so as to achieve optical amplification of radiations of interest, as known per se.

The III-V stack 108 preferably forms part of a laser component, e.g., a lateral current injection (LCI) laser or a vertical current injection (VCI) laser. More generally though, the III-V stack 108 may be configured as a laser, an optical detector or a semiconductor optical amplifier (SOA). As assumed in the accompanying drawings, the III-V materials of the stack 108 are stacked along a stacking direction z perpendicular to a main plane of the stack.

In all cases, the III-V stack 108 is capable of producing, detecting or amplifying radiation in a given range of wavelengths and, in particular, at a given average wavelength. The wavelength range of interest is in the optical range i.e., 100 nm-1 mm, according to DIN 5031. Thus, the terminology "radiation" as used herein refers to electromagnetic radiation in the wavelength range between 100 nm and 1 mm. However, the wavelength range will, in most applications as contemplated herein, be between 200 nm and 7.5 µm. In particular, wavelengths of 1.3 and 1.55 µm are typically contemplated (and possibly 980 nm), for datacom/telecom applications.

The second wafer component 2 is bonded to the first wafer component 1, so as for the III-V stack 108 to be in thermal communication with the thermal spreader. The stack is in fact typically structured, so as for the resulting, structured stack 108 to be precisely aligned with the thermal spreader(s) and other components of the device 11-14, as discussed later in reference to fabrication methods.

The thermal spreaders 104, 104a, 104b that fill the cavities 104c have, each, a refractive index that is lower than each of: (i) the refractive index of the Si substrate 100; and (ii) the average refractive index of the III-V stack 108, at least for radiations of interest for said stack 108. This constraint is to make sure that the presence of the thermal spreader(s) does not compromise fundamental optical functions of the cladding layer, needed to confine radiation and, possibly, allow radiation to be optically coupled from a waveguide 102 into the III-V stack 108 and vice versa.

Having one or more thermal spreaders 104, 104a, 104b integrated directly in the Si platform enables efficient heat transfer from the active optical device 107-109, which, in turn, allows thermal management of the electro-optical devices 11-14. However, the integration of the thermal spreader(s) does not come at the cost of increased dimensions for the electro-optical devices. Rather, the thermal spreaders are substituted for cladding volume portions that would else be present, such that the integration of the spreaders does not substantially impact the thickness of the devices.

Thus, the present approach can notably be used for the monolithic integration of III-V optoelectronic devices (e.g., lasers, detectors, semiconductor optical amplifiers) on Si Complementary Metal Oxide Semiconductor (CMOS) platforms, for which shallow III-V stacks (typically less than 500 nm thick) can advantageously be used. In that respect, the total thickness of the present (bonded) wafers 1, 2 shall preferably not exceed 500 nm. The average thickness of the combined wafers 1, 2 may for instance be between 50 nm and 400 nm, and, preferably, between 120 nm and 280 nm (as measured along axis z). The precise thickness depends on the actual optoelectronic device relied on. For instance, the thickness of a device integrating a lateral current injection laser will typically be less than the thickness of a device integrating a vertical current injection laser.

On the contrary, prior solutions typically consist in embedding the active optical component (e.g., a laser) on chip, whereby the active region is typically surrounded by silicon dioxide, a material with a poor thermal conductivity. As a result, the heat flows mainly laterally, on the sides of the active components and, this, through a small cross-section of silicon dioxide, implying a high thermal resistance. At variance with such prior approaches, the heat can here be more efficiently dissipated via the thermal spreader 104, 104a, 104b, yet without impacting dimensions of the device.

In embodiments, each cavity 104c realized in the cladding layer 101, 103 extends up to the Si substrate 100, so as for the thermal spreader(s) 104, 104a, 104b to be in contact with the underlying Si substrate 100, which may thus efficiently act as a heat sink. Such a cavity 104c is preferably etched down to the Si substrate. With a moderately high thermal conductivity of 149 W/m·K, Si conducts heat reasonably well, though perhaps not as efficiently as the material chosen for the spreader 104. However, the typical dimensions of the underlying Si substrate compensate for this. The thermal spreader relays thermal energy generated by the active device 107-109 (in particular by the III-V stack 108) and communicates it to the Si substrate 100, to form an integrated heat sink in the Si platform 11-14. In addition, the Si substrate (backside thinning) may possibly be thinned down (using known techniques) to attach a heat sink that offers higher thermal conduction than Si.

Yet, in variants, the intermediate thermal spreader 104 may be in thermal contact with other components of the device 11-14, possibly integrated therein, and which may act as a heat sink too. In other variants, a thin residual thickness of cladding layer 101 may separate the bottom surface (assuming the same orientation as in FIGS. 1-3) of the spreaders 104 from the top surface of the Si substrate 100, without this substantially impacting the thermal dissipation properties of the device 11-14. Thus, the heat spreader 104 is not necessarily in direct contact with the Si substrate 100.

Figure 2:
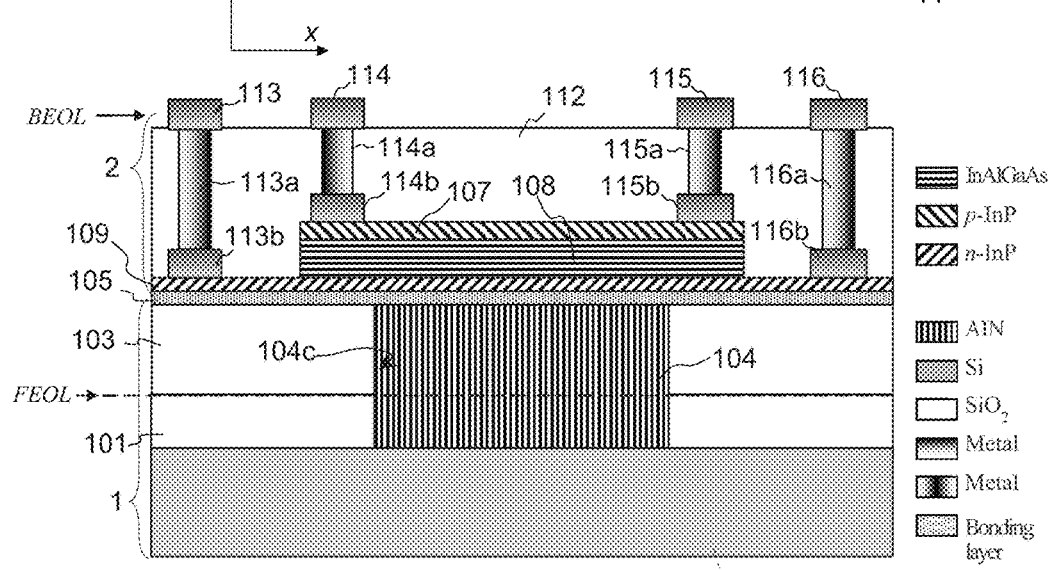

Referring more specifically to FIGS. 1-2, the III-V stack 108 is preferably structured so as to be vis-à-vis the thermal spreader 104. "Vis-à-vis" means that the III-V stack is opposite the thermal spreader, so as to at least partly face the latter. I.e., there is at least partial overlap between the projections of each of the III-V stack 108 and the thermal spreader on the bonding plane 105. A thermal spreader 104 may for instance be centered, under the stack 108, so as to optimize heat transfer and dissipation. In variants, the thermal spreader(s) may be slightly off-centered, e.g., to allow another component 102, e.g., if required for optical coupling purposes, as assumed in FIG. 3. But in that case, there are preferably two or more thermal spreaders 104a, 104b, each off-centered, on each side of the central component 102, and yet partially facing the stack 108.

Note that the heat is not only generated by the III-V stack 108 but also by surrounding parts 106, 107, 109 and, in a much less extent, the electrical contacts (e.g., 110, 111 in FIG. 1). Thus, one or more of the in-plane dimensions of the spreader(s) may advantageously exceed corresponding dimensions of the III-V stack 108. This is notably the case in FIG. 1, where the extension length of the spreader 104 along axis x exceeds that of the sole III-V stack 108. Similarly, the extension length along axis y of each spreader 104a, 104b in FIG. 4 slightly exceeds that of the III-V stack 108. In addition, although spreaders 104a, 104b involved in the embodiment of FIGS. 3 and 4 are separated, their total footprint (as measured along axis x, between outermost ends of the two spreaders) substantially exceeds that of the III-V stack 108. This makes it possible to capture heat generated by other, surrounding components, e.g., the contact vias 113-116b. In general, the footprint of the spreaders will preferably be at least equal (or substantially equal) to that of the III-V stack 108.

As evoked earlier, the first wafer component 1 is preferably structured from an SOI wafer 1, i.e., a wafer processed so as to have an oxide layer 101 (typically $SiO_2$) buried in the SOI wafer 1. Notwithstanding, another cladding layer 103 may be necessary, e.g., for optical coupling/embedding purposes, so that the cladding layer 101, 103 may actually be a composite layer, comprising the buried oxide layer 101 of the SOI wafer 1 and a second oxide layer 103 cladded on top of the first oxide layer 101. In that case, the cavity(ies) 104c extend(s) through the second oxide layer 103 and at least partly through the first oxide layer 101. Preferably though, the cavity(ies) 104c is(are) preferably etched down to the Si substrate 100, for reasons mentioned earlier.

The second oxide layer 103 may for instance directly coat the first oxide layer 101. As illustrated in FIG. 3, the second layer 103 may serve to embed a waveguide 102 for optical coupling purposes, the two oxide layers 101, 103 acting as a cladding layer. The second layer 103 may further serve to add gap distance and adjust optical coupling between the III-V stack 108 and the Si waveguide 102 in that case. The second layer may comprises $SiO_2$, just like the first oxide layer 101. Yet, the optical coupling may use a higher-refractive index material (e.g., $Al_2O_3$). In that case, the Si waveguide 102 can be cladded with a cladding structure 101, 103 that comprises, beyond the initial oxide material 101 (e.g., $SiO_2$), a distinct oxide material 103 (e.g., $Al_2O_3$), having a refractive index larger than that of the basis cladding material (for the radiation(s) of interest).

Still, optical coupling may also be achieved without the additional layer 103. However, in that case, the III-V stack 108 typically need be tapered down to allow the coupling. This prevents some applications, inasmuch as the tapered III-V regions may lead to the occurrence of unpumped regions and eventually to optical losses, which may be substantial, in particular for the III-V stack region.

If not needed to fabricate components such as waveguide 102, the top Si layer of the SOI substrate may be entirely removed, hence forming a stripped SOI substrate, free of any residual portion of the top Si layer. However, the top Si layer may be needed, e.g., to fabricate waveguides or other Si components, as in the embodiments of FIGS. 3-5, it being noted that the embodiments of FIGS. 1 and 2 would likely include waveguides too (though not shown). Thus, the cladding layer 101, 103 may comprise residual portions of the initial buried oxide layer 101 of the SOI wafer. In addition, the cladding 101, 103 may further comprise an additional oxide layer 103 on top, or residual portions thereof, thereby forming a composite oxide layer 101, 103 that is possibly structured. Typically, the cladding layer 101, 103 comprises one or more oxides. The cladding layers 101, 103 are preferably made of the same material, e.g., $SiO_2$, Sapphire (i.e., crystalline $Al_2O_3$) or amorphous $Al_2O_3$.

The two components 1, 2 are typically bonded via one or more bonding layers 105, 105a, 105b (see FIG. 8), made of a material selected so as to ensure a good thermal communication between the active component 107-109 and the heat spreaders 104, 104a, 104b. The bonding layer(s) may for instance comprise $SiO_2$ or $Al_2O_3$. The bonding layer will typically have a thickness that is less than 50 nm, preferably less than 30 nm. Interestingly, AlN—AlN bonding can further be contemplated. Using AlN for the bonding layer would for instance be particularly advantageous when otherwise using AlN for the thermal spreader, as discussed below. Yet, the thickness of the AlN bonding layer should preferably be limited to 20 nm in that case. Additional explanations as to the preferred fabrications methods are discussed later in detail, in reference to FIG. 8.

Referring now more particularly to FIGS. 3 and 4: an electro-optical device 13 according to embodiments may comprise a set of two or more cavities 104c formed in the cladding layer 101, 103, wherein the cavities 104c are filled to form a set of thermal spreaders 104a, 104b. Each of the thermal spreaders obtained is again subject to the same constraints as discussed earlier, in terms of electrical resistivity, refractive index (relatively to the III-V stack and silicon) and thermal conductivity. In particular, each of the spreaders has a thermal conductivity that is larger than that of the adjacent cladding layer 101, 103. Consistently with principles underlying the present invention, the III-V stack 108 is arranged so as to be in thermal communication with the thermal spreaders 104a, 104b of the set.

Preferably, the III-V stack 108 is, here again, arranged vis-à-vis the thermal spreaders 104a, 104b, i.e., so as to at least partly overlap with the latter. Having several spreaders 104a, 104b arranged in distinct cavities 104c allows one or more Si components 102 to be provided in residual portions between the cavities 104c. As evoked earlier, said components 102 may have been formed from the initial top Si layer of the SOI substrate 100.

In particular, and as depicted in FIGS. 3-4, the thermal spreaders obtained may include two spreaders 104a, 104b separated by a residual portion of the cladding layer 101, 103. This residual portion is arranged opposite the III-V stack 108. Here, the electro-optical device 11-14 further comprises a Si component 102 embedded in the residual portion of the cladding layer 101, 103. This Si component 102 is advantageously patterned from the initial top Si layer 102i of the SOI wafer 1.

This Si component may notably be a Si waveguide 102, arranged opposite the III-V stack 108. As further assumed in FIGS. 3, 4, the Si waveguide may be tapered to favor optical coupling to/from the III-V stack 108. In variants (not shown), additional Si components may be present (structured from that same top Si layer) and/or the Si waveguide core 102 may be further structured so as to comprise one or more, e.g., two, Distributed Bragg reflectors (DBR). The Bragg reflectors may be arranged in one or each of: an input portion and an output portion of the waveguide core, as known per se. In other variants, the electro-optical devices may be configured as a Distributed Feedback (DFB) laser, thanks to an optical waveguide core structured to comprise one or more distributed feedback reflectors arranged in a middle portion of the waveguide core, i.e., between the tapers (not shown).

In all cases, with the Si waveguide 102 underneath the III-V stack, the layer structure may be configured to optically couple radiation between the III-V stack and the Si waveguide 102. This optical coupling may be bidirectional or reciprocal, i.e., occur from the III-V stack 108 to the Si waveguide 102 and, conversely, from the Si waveguide 102 to the III-V stack 108, in operation of the device 13.

The optical coupling is ideally adiabatic. I.e., the Si waveguide 102 is preferably configured so as to enable adiabatic coupling with the III-V stack 108, whence the tapers in the Si waveguide 102, as visible in FIG. 4. Adiabaticity optical coupling is known per se. Adiabaticity condition is met when the optical distribution is defined by the same eigenmode i.e., supermode of the coupled system throughout the contact, with minimal scattering to other supermodes or radiation modes. Adiabaticity, however, is a relative term, as known; a coupler is considered to be adiabatic when the optical loss is below a predefined level, e.g. less than 15%, but typically less than 10%. Tapered portions of the Si waveguide 102 may be designed to optimize the optical coupling, while minimizing the optical coupling between the outer (wide) waveguide 102 portions. The length of the taper portions shall typically be between 10 μm and 10 mm, which range of lengths allow for exceeding adiabaticity limits, in practice.

The material used for fabricating the thermal spreader(s) 104, 104a, 104b is preferably CMOS-compatible. I.e., this material is preferably compatible with a CMOS fabrication process, while the process to fabricate the cavity(ies) 104c and the filling can be made compatible with a CMOS fabrication process (i.e., the structured wafer 1 may be CMOS-compatible). This notably allows the integration of the present electro-optical devices with CMOS integrated circuits.

Accordingly, at least parts of the present electro-optical devices 11-14 may be CMOS-fabricated. In particular, the III-V stack 108 may be embedded in the back end of the line (BEOL) of the electro-optical device 11-14. Still, the thermal spreader(s) will preferably be embedded partly in the back-end of the line and partly below the front-end of the line (FEOL), since the material used to fill the cavities may extend below the FEOL boundary, as assumed in FIGS. 1-3.

Figure 6:
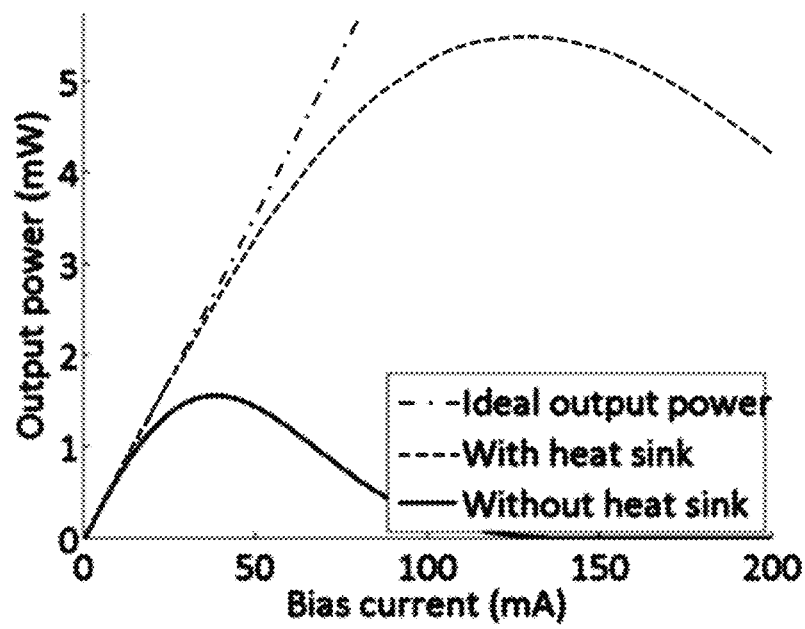
FIGS. 6 and 7 are graphs respectively comparing the output power and the temperature elevation as typically obtained with electro-optical devices according to embodiments (with integrated thermal management) and devices deprived of thermal management.
Figure 7:
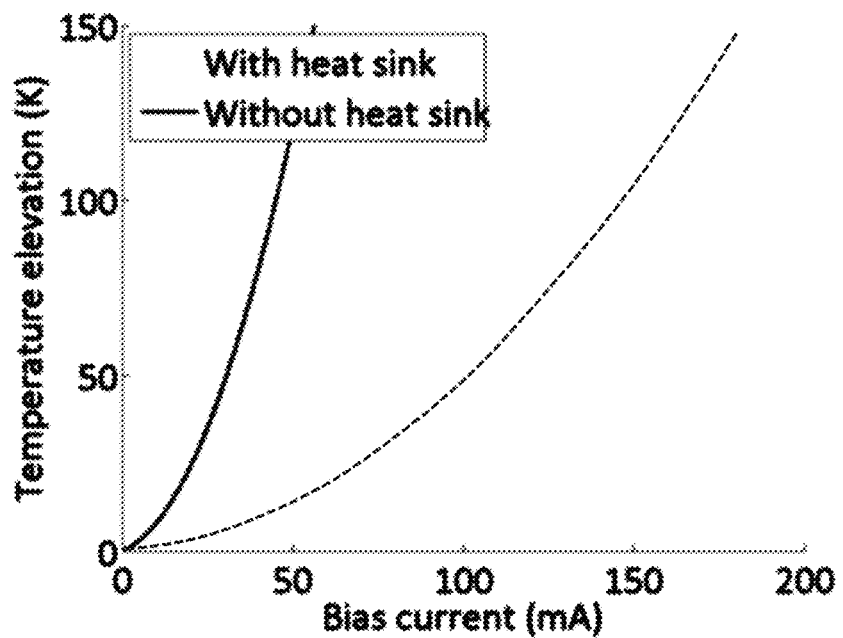

As evoked earlier, the present electro-optical devices 11-14 may notably include an edge-emitting laser device 106-109, the latter including said III-V stack 108. Having an integrated thermal spreader is of particular advantage in that case as the integration of laser sources on Si through wafer bonding would else lead to excessive heat and degrade the performance of lasers, by virtue of an effect known as the "self-heating effect". This effect is illustrated in FIGS. 6 and 7. Indeed, the ideal, theoretical output power of a LCI laser is a linear function of the bias current, as illustrated in FIG. 6. Now, for a "real" LCI laser, the linear regime only holds for small bias current values. For instance, assuming a low power cw (continuous wave), DBR laser on silicon (with a reflectivity on the output side of $R_2=0.9$)], where the laser is integrated in a shallow stack (less than 500 nm thick), the linear regime only holds for bias currents that are typically less than 20 mA. However, if thermal management is integrated (based on two heat spreaders in contact with the Si substrate) in an otherwise identical device (as in embodiments), we see that the output power can be substantially increased (e.g., by a factor two at 50 mA bias current and much more beyond 50 mA). In addition, substantial output power can be maintained over a much wider range of bias currents (>200 mA, FIG. 6). This can be imparted to the fact that integrated thermal management allows the elevation temperature of the device to be substantially lowered, which, in turn, mitigates adverse consequence of the self-heating effect (FIG. 7).

As assumed in FIGS. 1-4, the laser device 106-109 is preferably embedded in the III-V wafer component 2 in such a manner as to allow a common back-end of the line with other electronic components, where such additional components need be integrated within the same wafer component 2. I.e., metal plugs, interconnects and vias 113, 113a, 114, 114a, 115, 115a, 116, 116a (FIG. 3) can be processed through the various upper layers (not shown) down to the laser device 107-109 together with vias and metal plugs needed for the electronics (not shown). Similar arrangements are contemplated for the devices of FIGS. 1-2, and additional electronic components (not shown) may be integrated (parallel to the laser device 107-109) and electrically contacted in essentially the same way.

As illustrated in of FIG. 1, the electro-optical device 11 may notably include an edge-emitting, LCI laser source 106-109. A III-V LCI laser source is indeed particularly attractive thanks to its small threshold current and footprint, as well as the possibility to embed it in the back-end of the line of a CMOS chip, enabling a co-integration with other CMOS integrated circuits in the upper wafer component 1. Due to the thinner stack height of LCI lasers, such devices allow the integration at smaller nodes than their vertical current injection counterparts.

To dissipate the heat generated by LCI lasers, however, an integration on such small dimensions requires efficient thermal management, which is achieved thanks to an embedded thermal spreader 104 in the example of FIG. 1. The spreader has a lateral footprint that substantially exceeds that of the III-V stack 108, so as to capture heat dissipated not only by the stack 108, but also by the lateral structures 110, 111, as well as seed layers 106a, 106b and, in a less extent, the contact structures 110-111b.

In the example of FIG. 1, the seed layer 106b is a residual portion of a seed layer as initially used to grow the multiple quantum well (MQW) stack 108. The seed layer 106 is the cap layer of the initial deposition (e.g., MOCVD), which is upside down after bonding and can then acts as a seed layer for the contact layers 107,109. The layer 106 can further be used to grow the lateral structures 110, 111, in which the stack 108 is embedded, laterally. The seed layers 106, 106b may be made of InP or any other III-V compound material. The lateral structures 107, 109 are contact layers, which extends essentially parallel to the main plane of the stack 108, i.e., in the plane (x, y). The contact layers 107, 109 are assumed to comprise p- and n-doped InP in the example of FIG. 1. Typically, additional III-V layers are present, on top and bottom of the MQW stack 108, including Separate Confinement Heterostructures (SCH) 106a, typically comprising InAlGaAs. Thus, the active region of the stack 108 may be sandwiched between SCH layers 106a. A bonding layer 105 extends at the interface between the two wafer components 1, 2. The bonding layer 105 may in fact result from two separately deposited layers, as later discussed in reference to FIG. 8. For completeness, the upper components 107-111 are cladded with, e.g., an oxide layer 112, which may comprise SiO$_2$ or Al$_2$O$_3$, just like layers 101, 103.

In FIG. 1, symmetric sets of ohmic contacts (metal-semiconductor contacts) formed by 110b, 111b metal contacts joined by vertical metal vias 110a, 111a and top metal pads 110,111 (that can also act as interconnect wirings) are provided for lateral current injection in the stack 108. The ohmic contacts comprise p- and n-type contacts 110, 111, respectively, in contact with the p-doped layer 107 and n-doped layer 109. The ohmic contacts form sets that are symmetrically arranged with respect to the median vertical plane in this example.

In embodiments such as depicted in FIG. 2 or 3, the electro-optical device 12, 13 includes an edge-emitting, vertical current injection (VCI) laser device 107-109. Since current injection is now vertical, the contact layers 107, 109 (e.g, again made of InP) now extends parallel to the stack 108. The contact layer 109 has a larger footprint, so as to be contacted by off-centered ohmic contacts 113b, 116b, whereas inner contacts 114b, 115b are in electrical communication with the upper layer contact 107. The ohmic contacts are again formed by lower 113b, 114b, 115b, 116b metal contacts joined by vertical metal vias 113a, 114a, 115a, 116a and top metal pads 113, 114, 115, 116 (that can also act as interconnect wirings). Apart from the differences due to the vertical vs. lateral current injection (and, notably the absence of an i-InP layer), the devices 12, 13 of FIGS. 2, 3 are otherwise similar to the device 11 of FIG. 1. FIG. 3 additional comprises an embedded Si component 102, as discussed earlier.

Although not depicted in FIGS. 2-3, the layer stack 108 of the vertical current injection laser devices may further comprise an electron blocking layer (or EBL), e.g., comprising InAlAs and extending parallel to the main plane of the stack 108, so as to separate the latter from the p-doped layer. At present, preferred materials and desired physical properties for the various components 100-104, 108 as involved in the electro-optical devices 11-14 are discussed.

To start with, the cladding layers 101, 103, 112 typically comprise a same material, e.g., SiO$_2$, Sapphire (i.e., crystalline Al$_2$O$_3$) or amorphous Al$_2$O$_3$, as mentioned earlier. Most typically yet, the cladding layers 101, 103, 112 comprise SiO$_2$.

Next, the III-V stack 108 may comprise In$_{1-x-y}$Al$_x$Ga$_y$As (0≤x≤1, 0≤y≤1−x). I.e., a range of materials can thus be contemplated, including InAs, AlAs, InGaAs (e.g., for quantum dots lasers) and InAlGaAs. In particular, InAs quantum dots can be contemplated when using a GaAs substrate. In variants, the III-V stack 108 may comprise InGaAsP or InGaAsN. In general, the III-V stack 108 may comprise a multiple quantum well (MQW) section sandwiched between other III-V materials, e.g. InP, or GaAs, preferably lattice matched to the MQW section to prevent oxidation, as needed to start the growth of the core III-V stacked layers. The III-V stack 108 may also comprise quantum dots sandwiched between quantum wells, as known per se.

Such a layer stack 108 is relatively easy to grow, e.g., by molecular beam epitaxy MBE or by metal-organic chemical vapor deposition MOCVD. The semiconductor materials can be doped, if necessary, and preferably in conjunction with strain, e.g., to tune the bandgap.

The effective refractive index of the III-V stack will typically be of 3.3-3.4, whereas the refractive index of silicon is of about 3.5, for wavelengths of interest. Thus, the spreader material typically need be lower, e.g., less than 3.1, to ensure appropriate optical confinement and coupling (where necessary). Preferably, the refractive index of each the thermal spreader 104, 104a, 104b is less than 2.5, e.g., for a wavelength larger than 200 nm, and so as to ensure a sufficient difference of effective refractive indices between, on the one hand, the spreaders 104 and, on the other hand, the active optical materials of the stack 108 and the silicon waveguide 102.

To meet such a requirement, as well as other equally important requirements in terms of thermal conductivity and electrical resistivity, suitable materials for the thermal spreaders 104, 104a, 104b may notably be diamond, boron nitride (BN) or aluminum nitride.

Boron Nitride has a refractive index that is typically between 1.8 and 2.1. Its thermal conductivity is typically in the range of 20-740 W/m·K (depending on its exact structure and thickness), while its electrical resistivity will typically be in the range of $10^6$-$10^{11}$ Ω·m.

Diamond has a refractive index of 2.4, as well as a very large thermal conductivity (900-2320 W/m·K and a very large electrical resistivity $10^{11}$-$10^{18}$ Ω·m.

It is, however, preferred to use aluminum nitride (AlN), which has a larger thermal conductivity (typically 60-285 W/m·K) than SiO$_2$ (whose thermal conductivity is typically in the range 1-12 W/m·K), a refractive index of 1.9-2.2 (vs. 1.5 for SiO$_2$), and a larger electrical resistivity ($10^5$-$10^{12}$ Ω·m vs. $10^8$ Ω·m for SiO$_2$). AlN as deposited in the cavities typically has a hexagonal wurtzite crystalline structure, though it may also be cubic or, even, amorphous. Aluminum nitride AlN is a wide band-gap (6.2 eV) III-V compound. Thin (wurtzite) films of AlN will have a sufficiently high thermal conductivity (e.g., 180 W/m·K), high electrical resistivity (e.g., p=$10^9$-$10^{11}$ Ω·m). Yet, the electrical resistivity value of AlN may slightly vary, depending on doping. In the present context, one preferably seeks a spreader having a resistivity of at least $10^4$ Ω·m (and more preferably at least $10^6$ Ω·m). In all cases, the minimal electrical resistivity and the minimal thermal conductivity of the spreader need be substantially larger than those of the base cladding material (e.g., SiO$_2$ or Al$_2$O$_3$).

Figure 5:
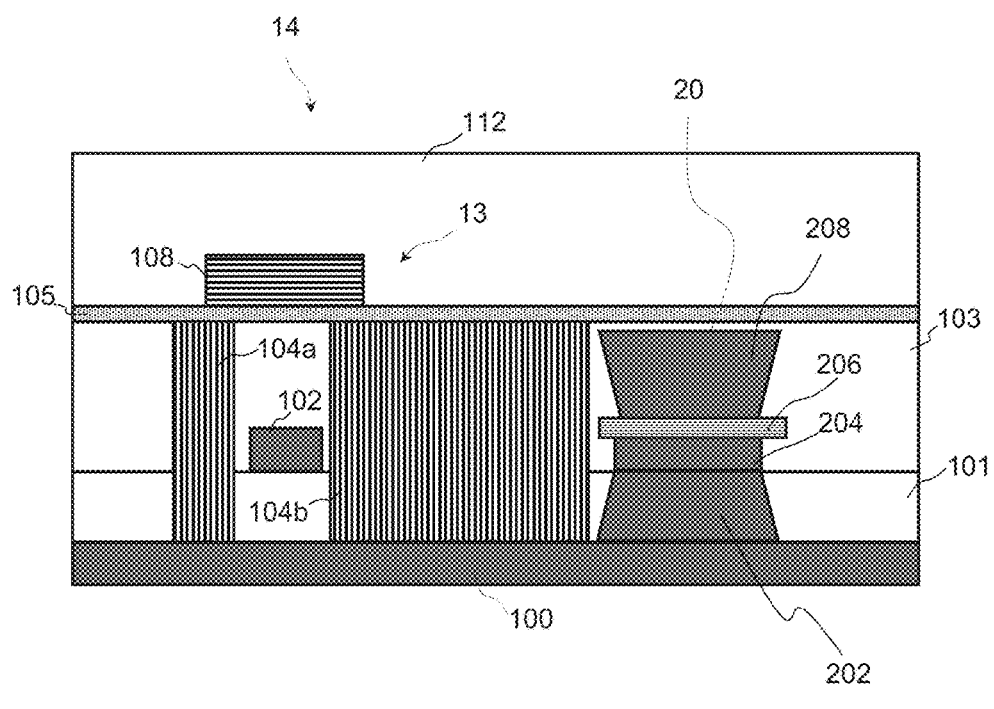
FIG. 5 is a 2D cross-sectional view of a silicon photonics chip with thermal spreaders and heat sinks integrated therein, wherein an electro-optical device is co-integrated with a heterostructure bipolar transistor, according to embodiments.

According to another aspect, the invention can be embodied as a Si photonics chip 14, such as depicted in FIG. 5. The chip 14 comprises an electro-optical device 11-14, such as described earlier in reference to FIGS. 1-4, integrated therein. Additional components may typically be co-integrated on the same chip 14, as illustrated in FIG. 5. Note that, in that case, the thermal spreaders 104a, 104b may be arranged in the device so as to be able to evacuate heat from several components 13, 20, as assumed in FIG. 5. To that aim, the spreaders may have different sizes and be differently offset with respect to a reference electro-optical component 13, so as for one 104b of the spreaders to also neighbor another component 20 of the chip 14.

In general, the chip 14 may co-integrate CMOS components, BiCMOS, Si photonics components, etc. The present devices 11-14 may form parts of a photonic circuit device, which may comprise a CMOS front-end-of-line (FEOL), or a bipolar CMOS FEOL. For example, a photonic circuit device may comprise a wafer and a buried oxide layer, with electronics on top and passive photonics.

In the simple example of FIG. 5, the chip 14 comprises, in addition to an electro-optical component 13 (similar to that of FIG. 3), an integrated circuit (IC) 20, which is integrated with the electro-optical device 13. Both devices 13, 20 can notably be integrated as a Si CMOS integrated circuit.

The IC 20 may be regarded as being monolithically integrated with the electro-optical device 13. In the literature, however, the terminology "monolithically integrated laser" often involves heteroepitaxy on silicon. Lasers, integrated through a bonding process as contemplated in embodiments herein are mostly referred to as heterogeneously integrated. Yet, beside the bonding process, remaining steps of the fabrication process will typically be similar to a monolithical integration. Accordingly, embodiments allow a platform to be obtained, which integrates III-V lasers into a CMOS fabrication process.

In embodiments, this IC 20 is integrated with the electro-optical device 13 on the same Si substrate 100 that otherwise supports the device 13, as assumed in FIG. 5. That is, a same substrate 100 is used to support each of the devices 13, 20. However, in variant, the bonding may be performed on top of these devices 10, 20, e.g., after planarization, such that wafer bonding is possible, based on distinct substrates.

In embodiments, the optoelectronic device 14 is a BiCMOS device and the IC 20 comprises a heterostructure bipolar transistor, or HBT, as in FIG. 5. The HBT may be supported on the same Si substrate 100 as used for the device 10, as evoked just above. More generally though, the HBT 20 may be co-integrated as a mere CMOS IC or a Bipolar IC.

In the example of FIG. 5, the stack 108 is laterally embedded in a cladding medium 112, whereas other components 101, 202-208 are laterally embedded in the cladding medium 101-103, which otherwise includes the spreaders 104a, 104b. The HBT 20 comprises a selective Si epitaxy layer 202 and, in addition, a Si collector 204, a silicon-germanium base 206 ($Si_xGe_{1-x}$, with $0 \leq x \leq 1$) and a Si emitter 208. Of course, not all components of the HBT 20 are depicted, for clarity. In particular, contacts of the HBT 20 are not shown.

Figure 8:
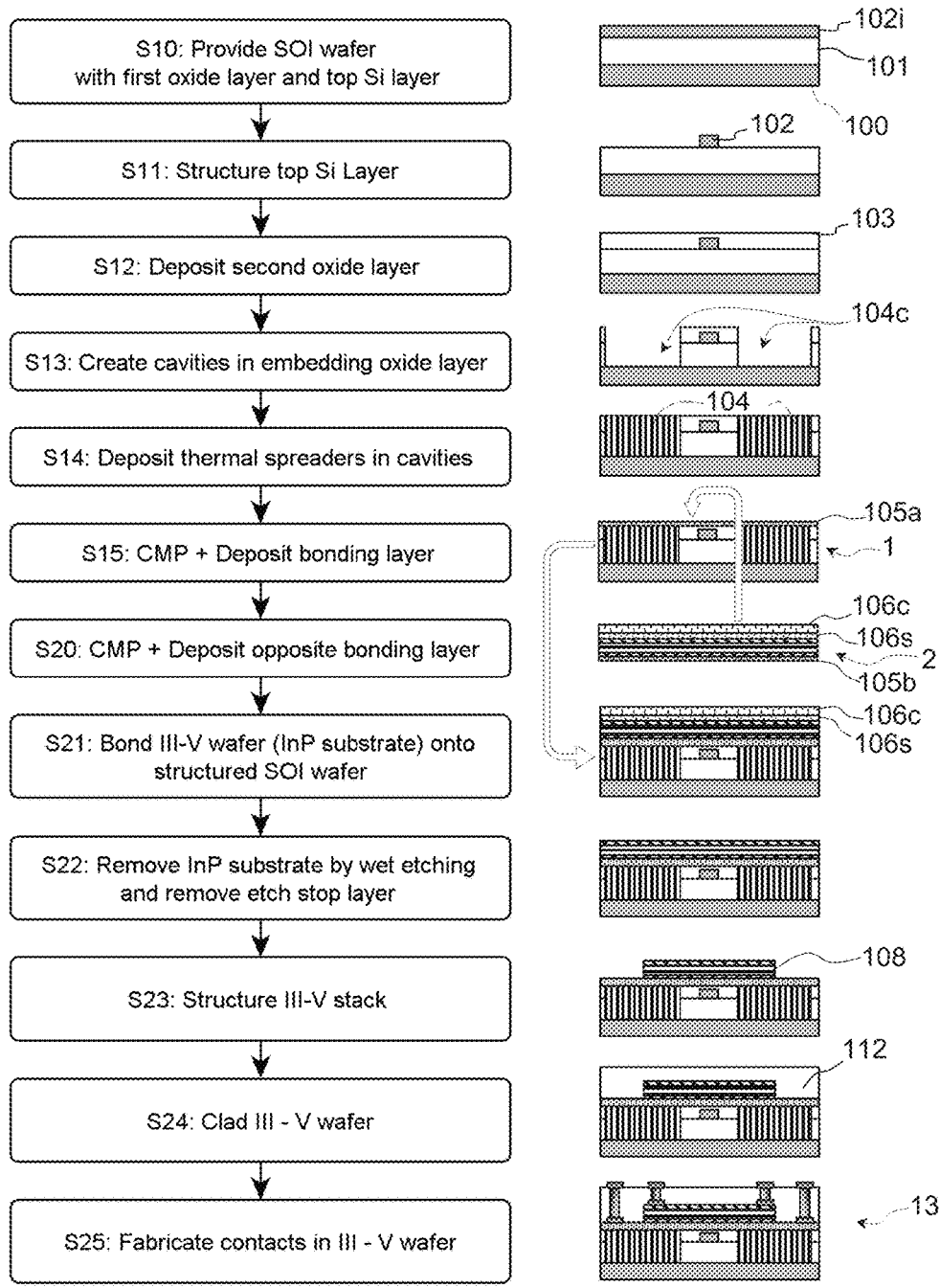
FIG. 8 shows an illustrated flowchart representing high-level fabrication steps of an electro-optical device, according to embodiments.

Referring now to FIG. 8, another aspect of the invention is described, which concerns methods of fabrication of an electro-optical device 11-14 as described earlier in reference to FIGS. 1-5. Many aspects of such fabrication methods have already been implicitly addressed in the description of the devices 11-14. The present fabrication methods are accordingly only briefly summarized in the following.

Two structured wafer components 1, 2 need be achieved. The present methods may either comprise a complete fabrication of each of these components. In variants, they rely on already partially fabricated wafers 1, 2. In all cases:

A first wafer component 1 may initially be provided (e.g., as a SOI wafer) or fabricated (steps S10-S12, FIG. 8). This wafer 1 comprises a Si substrate 100 and a cladding layer 101, 103 on top of the Si substrate 100. If necessary, a second oxide layer 103 may be deposited S12 on the buried oxide 101 of the SOI wafer 1, so as to form a dual cladding layer 101, 103; and A second component 2 is needed (step S21 and beyond), which comprises a III-V stack 108.

One or more cavities 104c are created at step S13 in the cladding layer 101, 103 of the first wafer 1. The cavities can be etched using standard etching techniques. For example, the cavities can be formed by etching silicon dioxide 101, 103 down to the Si substrate 100 using standard plasma etching techniques. In variants, the cavities are only partially etched through the layers 101, 103.

The cavities are next filled S14 with a material to form the thermal spreaders 104 (e.g., by sputtering or using chemical vapor deposition techniques). As explained earlier, the material(s) used for the thermal spreader(s) meets specific requirements in terms of thermal conductivity, electrical resistivity and refractive index.

Finally, the two components 1, 2 are wafer bonded S20-S21. In addition, the III-V stack as initially provided on the wafer 2 is further structured S22, S23 to obtain a structured stack 108, arranged vis-à-vis the thermal spreaders 104 and in thermal communication therewith.

The first wafer component 1 is typically flattened by chemical mechanical polishing (CMP) prior to bonding S20, S21 with the III-V wafer 2. Preferably, CMP is also performed at step S15, prior to depositing bonding layer 105a. An additional capping layer 105b (e.g., $Al_2O_3$) may be deposited on the III-V wafer, to obtain high bonding strength, step S20. CMP may further be performed after depositing S15, S20 each bonding layer 105a, 105b on both side, and before bonding S21. The second wafer 2 may initially be provided on a substrate 106c (e.g., InP), coated by an etch stop layer 106s. Still, layers 106c, 106e can removed at step S22, where the InP substrate is first removed by wet etching and the etch stop layer is subsequently removed, also by wet etching.

As seen above, various processes can be involved in the fabrication of the devices, which are nevertheless commonly used, individually, in the semiconductor industry.

In embodiments, one may want to further allow an optical coupling as in FIG. 3. Advantageously, then, a SOI wafer 1 can be used S10, which comprises the Si substrate 100, a buried oxide layer 101 on top of the Si substrate 100 and a top Si layer 102i on top of the first oxide layer 101. The top Si layer of the SOI wafer 1 can thus be structured S11 to obtain a Si component 102, as needed for the desired optical coupling. Else, the top Si layer could be simply removed. Next, the second oxide layer 103 deposited S12, so as to form a cladding layer 101, 103, with the Si component 102 embedded therein. Because this Si component 102 (e.g., a waveguide core) may need be centrally arranged below the stack 108, at least two cavities 104c may be created, separated by a residual portion of the cladding layer 101, 103 in between, with the Si component 102 embedded in said residual portion, prior to filling the two cavities 104c etched to form respective thermal spreaders 104.

The above embodiments have been succinctly described. They may include components or structures that are not necessarily shown in the accompanying drawings, for the sake of conciseness. For example, electrodes and contacts were not systematically depicted, for conciseness. As another example, some of the present electro-optical devices may be configured as a distributed Bragg reflector laser. To that aim, the optical waveguide core may be structured so as to comprise one or more, e.g., two, Bragg reflectors arranged in one or each of: an input portion and an output portion of the waveguide core. In variants, the electro-optical devices may be configured as a distributed feedback laser, thanks to an optical waveguide core structured so as to comprise one or more distributed feedback reflectors arranged in a middle portion of the waveguide core, i.e., between the tapers.

Some of the methods described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications to advanced computer products.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other materials than those explicitly listed in respect of the stack 108, the contact layers 107, 109, the cladding materials 101, 103, 112 or the thermal spreaders 104, 104a, 104b can be contemplated.

What is claimed is:

1. An electro-optical device, comprising:
    a first wafer component, comprising a silicon on insulator wafer having a substrate and a cladding layer on top of the silicon substrate, the cladding layer comprising a cavity formed therein, the cavity filled with an electrically insulating thermal spreader, which has a thermal conductivity larger than that of the cladding layer, the cavity in the cladding layer extending to the silicon substrate, so as for the thermal spreader to be in contact with the silicon substrate; and
    a second wafer component, comprising a stack of III-V semiconductor gain materials, designed for optical amplification of a given radiation,
wherein
    the second wafer component is bonded to the first wafer component, such that an underside surface of said stack of III-V semiconductor gain materials is in thermal communication with the thermal spreader; and
    the thermal spreader having a refractive index that is lower than each of: the refractive index of the silicon substrate; and an average refractive index of the stack of III-V semiconductor gain materials for said given radiation, and the cladding layer comprises:
        a first oxide layer, corresponding to a buried oxide of the silicon on insulator wafer; and
        a second oxide layer on top of the first oxide layer, and wherein
    said cavity extends through the second oxide layer and at least partly through the first oxide layer.

2. The electro-optical device according to 1, wherein the stack of III-V semiconductor gain materials is structured to face with and at least partially overlap the thermal spreader.

3. The electro-optical device according to claim 1, wherein
    the thermal spreader has a thermal conductivity that is at least ten times larger than that of the cladding layer.

4. The electro-optical device according to claim 1, wherein
    the electro-optical device comprises a set of two or more cavities formed in the cladding layer, including said cavity, the cavities of the set filled with respective, electrically insulating, thermal spreaders, including said thermal spreader, each of the thermal spreaders having a thermal conductivity larger than that of the cladding layer, wherein said stack of III-V semiconductor gain materials is arranged so as to be in thermal communication with the thermal spreaders.

5. The electro-optical device according to claim 4, wherein
    said thermal spreaders include two spreaders separated by a residual portion of the cladding layer, said residual portion being arranged opposite the stack of III-V semiconductor gain materials, and
    the electro-optical device further comprises a silicon component embedded in the residual portion of the cladding layer, said component structured from an initial top silicon layer of the silicon on insulator wafer.

6. The electro-optical device according to claim 5, wherein
    said silicon component is a silicon waveguide, arranged opposite the stack of III-V semiconductor gain materials.

7. The electro-optical device according to claim 1, wherein
    the thermal spreader is a CMOS-compatible material.

8. The electro-optical device according to claim 7, wherein
    the electro-optical device is a CMOS-fabricated device and the stack of III-V semiconductor gain materials is embedded in the back end of the line of the electro-optical device.

9. The electro-optical device according to claim 1, wherein
    the electro-optical device comprises an edge-emitting laser device, the latter including said stack of III-V semiconductor gain materials.

10. The electro-optical device according to claim 9, wherein
    the laser device is embedded in the second wafer component so as to allow a common back end of the line with other electronic components integrated within in the second wafer component.

11. The electro-optical device according to claim 9, wherein
    the laser device is an edge-emitting, lateral current injection laser device.

12. The electro-optical device according to claim 9, wherein
    the laser device is an edge-emitting, vertical current injection laser device.

13. The electro-optical device according to claim 1, wherein
    the thermal spreader has a refractive index that is less than 2.5 for a wavelength larger than 200 nm.

14. The electro-optical device according to claim 1, wherein
    the thermal spreader comprises one or more of the following materials:

diamond;
boron nitride; and
aluminum nitride.

15. The electro-optical device according to claim 14, wherein
the thermal spreader comprises aluminum nitride.

16. The electro-optical device according to claim 1, wherein
said stack of III-V semiconductor gain materials comprises one of: $In_{1-x-y}Al_xGa_yAs$, with $0 \leq x \leq 1$ and $0 \leq y \leq 1-x$; InGaAsP; and InGaAsN.

17. A silicon photonics chip, comprising an electro-optical device integrated therein, wherein the electro-optical device, comprises:
a first wafer component, comprising a silicon on insulator wafer having a substrate and a cladding layer on top of the silicon substrate, the cladding layer comprising a cavity formed therein, the cavity filled with an electrically insulating thermal spreader, which has a thermal conductivity larger than that of the cladding layer, the cavity in the cladding layer extending to the silicon substrate, so as for the thermal spreader to be in contact with the silicon substrate; and a second wafer component, comprising a stack of III-V semiconductor gain materials, designed for optical amplification of a given radiation,
wherein
the second wafer component is bonded to the first wafer component, such that an underside surface of said stack of III-V semiconductor gain materials is in thermal communication with the thermal spreader; and
the thermal spreader has a refractive index that is lower than each of:
the refractive index of the silicon substrate; and
an average refractive index of the stack of III-V semiconductor gain materials for said given radiation,
and the cladding layer comprises:
a first oxide layer, corresponding to a buried oxide of the silicon on insulator wafer; and
a second oxide layer on top of the first oxide layer, and wherein
said cavity extends through the second oxide layer and at least partly through the first oxide layer.

* * * * *